United States Patent
Dour et al.

(10) Patent No.: US 7,751,274 B2
(45) Date of Patent: Jul. 6, 2010

(54) EXTENDED SYNCHRONIZED CLOCK

(75) Inventors: Navneet Dour, Folsom, CA (US); Joe H. Salmon, Placerville, CA (US)

(73) Assignee: Intel Corporation, Santa Clara, CA (US)

(*) Notice: Subject to any disclaimer, the term of this patent is extended or adjusted under 35 U.S.C. 154(b) by 414 days.

(21) Appl. No.: 11/516,165

(22) Filed: Sep. 5, 2006

(65) Prior Publication Data

US 2008/0065922 A1 Mar. 13, 2008

(51) Int. Cl.
*G11C 8/00* (2006.01)
(52) U.S. Cl. .............. 365/233.1; 327/144; 327/156; 365/226; 365/233.11; 365/233.12
(58) Field of Classification Search .......... 327/147, 327/156, 144, 158; 365/233.1, 233.11, 226; 365/233.12; 713/500, 503
See application file for complete search history.

(56) References Cited

U.S. PATENT DOCUMENTS

| | | | |
|---|---|---|---|
| 5,463,351 A * | 10/1995 | Marko et al. ................. 331/1 A |
| 5,610,558 A * | 3/1997 | Mittel et al. ................... 331/2 |
| 5,748,569 A * | 5/1998 | Teodorescu et al. ......... 368/118 |
| 6,195,759 B1 | 2/2001 | Salmon |
| 6,297,702 B1 * | 10/2001 | Locker et al. .................. 331/2 |
| 6,414,539 B1 | 7/2002 | Srikanth et al. |
| 6,463,013 B1 * | 10/2002 | Liu et al. ..................... 368/155 |
| 6,662,305 B1 | 12/2003 | Salmon et al. |
| 6,810,486 B2 * | 10/2004 | Fayneh et al. ............... 713/503 |
| 6,842,056 B1 * | 1/2005 | Wong et al. ................. 327/147 |
| 7,042,259 B2 * | 5/2006 | Kurd et al. ................... 327/147 |
| 7,307,900 B2 | 12/2007 | Salmon et al. |
| 7,324,403 B2 | 1/2008 | To et al. |
| 7,401,246 B2 | 7/2008 | Martin et al. |
| 7,555,670 B2 | 6/2009 | Mohanavelu et al. |
| 7,602,859 B2 | 10/2009 | Cheng et al. |
| 2006/0245473 A1 | 11/2006 | Cheng et al. |
| 2007/0291828 A1 | 12/2007 | Martin et al. |
| 2008/0244303 A1 | 10/2008 | Martin et al. |

* cited by examiner

*Primary Examiner*—Dang T Nguyen
*Assistant Examiner*—Alexander Sofocleous
(74) *Attorney, Agent, or Firm*—Erik R. Nordstrom

(57) ABSTRACT

Some embodiments are directed to circuits comprising first and second PLLs. The first PLL generates a first clock signal based on a reference clock signal. The second PLL generates a second clock signal based on the reference clock signal and is synchronized with the first clock signal.

18 Claims, 2 Drawing Sheets

EXTENDED SYNCHRONIZED CLOCK

BACKGROUND

A clock source in a first area of a chip may be used to provide an extended clock in a different area of the chip or even off-chip to implement a synchronous data transfer. For example, in a memory controller, system memory clocks for off-chip memory are typically generated off of a host clock from the memory controller.

With reference to FIG. 1, a circuit for generating an extended clock is generally shown. It comprises a phase locked loop (PLL) 102 that receives a clock reference signal (REF CLK) and from it generates an output clock signal that drives a clock tree 104. The PLL 102 also receives a feedback signal tapped from the clock output downstream from the clock tree 104, through an extended feedback path 107, to track the output clock signal against the reference clock. (Feedback path 107 is referred to as being "extended" because it is relatively long due to the robust nature of the clock tree 104.) The output clock signal is driven through clock driver 106 and provided as an extended clock signal (EXT CLK). Unfortunately, with the feedback path 107 being relatively long and proximal to the clock tree 107, the CLK signal may be noisy an susceptible to jitter, which is transferred to the extended clock signal. This can be especially problematic for extended clock signals used for system memory clocks.

FIG. 2 shows a block diagram of a clock generator in a memory controller core 201 used to drive local clock trees and to provide the system memory clock through I/O interface 211 to off-chip memory devices. It has a PLL 202 in the Memory Controller Core 201. The PLL 202 receives a reference clock (REF CLK) and from that generates a host clock signal (Host CLK) at first and second outputs to clock trees in first and second domains 204A, 204B. The output clock loads (including the clock trees) are matched to one another. An extended feedback path 207 is provided from the output of the first domain clock tree 204A back to the PLL 202 to track the Host CLK signal against the REF CLK signal. The Host CLK signals also drive flip flops 207A, 207B and decision logic 209 to transmit data (not shown) to the IO Interface 211 through data flip-flop 213 and data driver 216. The Host CLK signal is also driven through clock driver 218 to provide an extended version of the Host CLK signal (EXT Host CLK).

Thus, the MC Core PLL 202 generates the system memory clock, as well as the host clock, which is used as the source for the system memory clock. This simplifies timing relationships between the memory controller and system memory interface, but with the feedback being tapped downstream from the clock trees (which may be relatively large), any low frequency noise in the memory controller core can influence the behavior of the PLL and in turn, the quality of the system memory clock. Even more problematic, however, high frequency noise also impacts the system memory clock making it difficult to meet performance requirements such as jitter.

Accordingly, an improved extended clock solution may be desired.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

Figure 3:
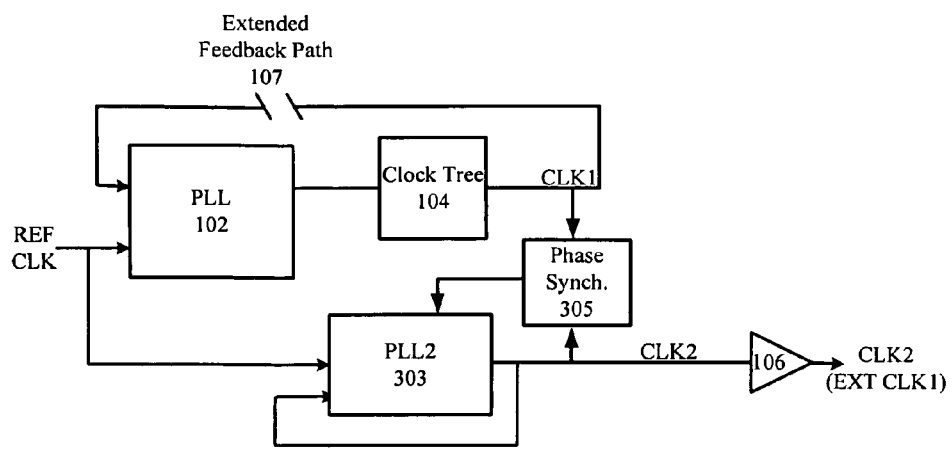
FIG. 3 is a block diagram of a clock generator with an extended synchronous clock in accordance with some embodiments.

FIG. 3 is a block diagram of a circuit to generate an extended clock from a source clock generated by a PLL 102. The PLL 102 generates the source clock (CLK1 off of a reference clock (REF CLK) and drives a clock tree load 104. It has an extended feedback path 107 coupling the output at the clock tree 104 back to the PLL 102 to track it against the reference clock signal. (It should be appreciated that the feedback may be tapped from within the clock tree or even ahead of it depending on the particular design.)

The circuit also comprises a synchronizer 305 and an independent, second PLL (PLL2) 303 to generate an extended clock signal (CLK2), which is driven through a clock driver 106 as indicated. The second PLL 303 has a local feedback path to couple its output clock (CLK2) back to its input to track it against the reference clock signal (REF CLK), which is provided to the second PLL 303, as well as to the first PLL 102. (A "local" feedback path means a feedback path that is, for example, sufficiently short, shielded, and/or away from problematic noise sources to allow the second PLL to generate a clock signal with sufficient quality.) Thus, the first and second PLLs generate copies of the common reference clock but with the second PLL copy being "cleaner" than the first PLL copy.

The first (source) and second clocks are provided to the phase synchronizer 305 to synchronize them with one another. In the depicted embodiment, the phase synchronizer controls the second PLL 303 to synchronize the second clock (CLK2) with the source clock. It should be appreciated, however, that it could control the phase of the second clock through any suitable circuitry in the path of the second clock. Additionally in some embodiments, the second PLL 303 may be powered by a supply that is isolated from the first PLL 102, which may reduce noise and/or jitter even further from the second clock signal.

Thus, at the output of driver 106, an extended version of the first clock signal is provided. This signal may be supplied at relatively long distances from the first PLL 102 and yet be relatively clean and have reduced jitter, not withstanding the fact that the clock tree 104 may be large and noisy.

Figure 4:
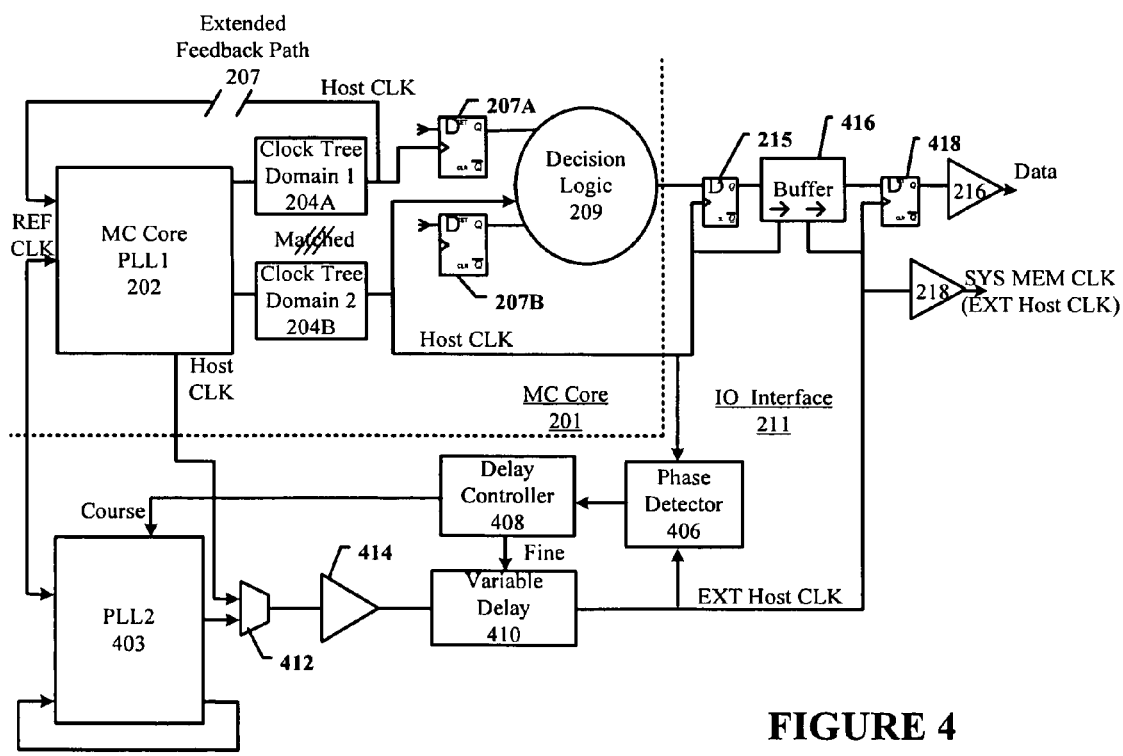
FIG. 4 is a block diagram of a clock generator in a memory controller having an extended system memory clock in accordance with some embodiments.

FIG. 4 shows a block diagram of a circuit to generate a system memory clock from a host clock in a memory controller. The memory controller comprises a core section 201 and an IO interface section 211, which may be relatively distant from the core 201. (Note that the memory controller could be part of a larger integrated circuit such as a microprocessor, or it could be part of a more specialized chip such as a memory controller or graphics memory controller chip.) A first PLL 202 is included in the core section 201 to generate a Host CLK signal off of a reference clock (REF CLK). In the depicted embodiment, the Host CLK signal drives matched clock tree loads 204A, 204B in first and second domains. The Host CLK is fedback to PLL 202 from the output of one of the clock tree loads (clock tree 204A in the depicted embodiment) through an extended feedback path 207 so that it can track the Host CLK against the reference clock.

The Host CLK is also provided to data flip-flops 207A, 207B, decision logic 209 and to data flip-flop 215 to implement data transfers between the memory controller and memory (e.g., off-chip) through the IO interface 211. Note that this drawing is simplified regarding the clock tree loads and data transfer details for ease of understanding. The PLL 202 could be driving clock loads in only one domain or in multiple domains, and the particulars of data transfer could be implemented in any suitable way depending upon the implemented protocol (e.g., DDR, DDR2, PCI EXP, etc.) and on particular design considerations.

The circuit also comprises a second PLL 403 to generate an extended host clock signal (EXT Host CLK) to serve as a system memory clock. It receives as input the reference clock signal (REF CLK) and the EXT Host CLK signal fed back to it, via a local feedback path, to track the EXT Host CLK against the reference clock. It also comprises phase detector 406, delay controller 408, variable delay circuit 410, multiplexer 412 and clock driver 414 to implement synchronization of the Host CLK and EXT Host CLK signals in the depicted embodiment. The variable delay circuit 410, multiplexer 412, and clock driver 414 are cascaded together in the path of the EXT Host CLK signal as indicated. The multiplexer passes either the EXT Host CLK signal from PL2 403 or the Host CLK from PLL1 202 (control signal not shown). Under normal operation, it passes the EXT Host CLK signal but can pass the Host CLK signal, for example, as a back-up in case something happens to the second PLL 403.

The EXT Host CLK is driven through clock driver 414 to the phase detector 406, which also receives the Host CLK signal from the MC Core section and compares its phase with the EXT Host CLK phase to provide to the delay controller 408 a signal indicating whether the phase of the EXT Host CLK leads or lags the phase of the Host CLK signal. Based on this phase indication signal, the delay controller 408 controls the PLL 403 (which serves as a course tune delay adjustment) and/or the variable delay circuit 410 (which serves as a fine tune delay adjustment) to synchronize the Host CLK and EXT Host CLK signals with one another. It should be appreciated that the phase detector 406, delay controller 408, variable delay circuit 410, and PLL 403 could be implemented with any suitable circuitry to perform delay control operations. For example, a state machine or other suitable logic could be used to implement delay controller 408 and control delay at the PLL 403 and/or variable delay circuit 410. Likewise, the course and fine delay control blocks could be implemented with a variety of different circuits. In some embodiments, for example, the delay controller 408 essentially disables a VCO output in the PLL 403 for a given amount of time depending on the phase difference between EXT Host CLK and Host CLK to coarsely align their phases, while the variable delay circuit 410 is appropriately controlled (e.g., with a digital signal controlling its delay) for fine tune delay adjustment to synchronize the signals. In some embodiments, either the fine or coarse tune circuits could be omitted depending on performance objectives and other design considerations.

In the depicted embodiment, the IO interface 211 also comprises a memory buffer 416 and flip-flop 418 (in addition to data driver 216 and clock driver 218) to transfer data out of the IO interface 211. The data buffer 416 holds data in case the EXT Host and Host clocks are not yet operational together, e.g., at start-up. It functions like a first-in-first-out (FIFO) buffer, clocking data into its input when the Host CLK asserts and clocking data out of its output when the EXT Host CLK signal asserts. It receives data clocked into its input from flip-flop 215 by the Host CLK signal and outputs data clocked to flip-flop 418 by the EXT Host CLK signal.

With the depicted clock generator circuit, a system memory clock (EXT Host CLK) can be provided that is sufficiently the same as the memory controller host clock (REF CLK copies and in synchronization with each other) but not affected by its noise and lengthy feedback path, which allows it to be cleaner and have less jitter. Along these lines, for even greater signal quality, the second PLL 403 may be powered by a supply that is isolated from the first PLL supply. It may be located in the MC core, the IO interface or in some other suitable location depending on, for example, routing and noise considerations both for the REF CLK and EXT Host CLK signals.

Figure 1:
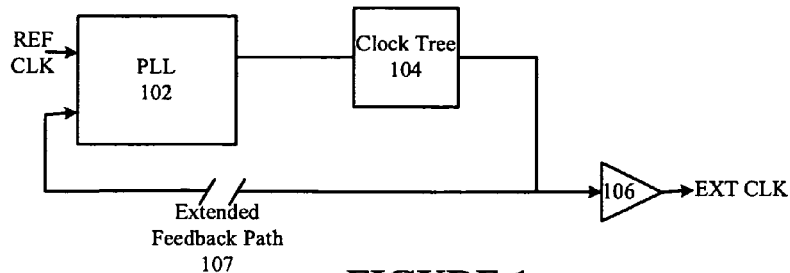
FIG. 1 is a block diagram of a PLL clock generator.
Figure 2:
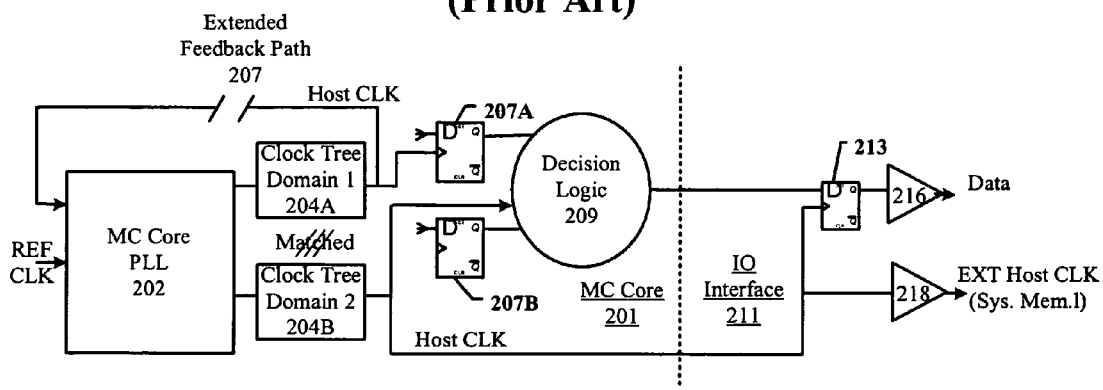
FIG. 2 is a block diagram of a conventional clock generator in a memory controller core providing an external system memory clock.
Figure 5:
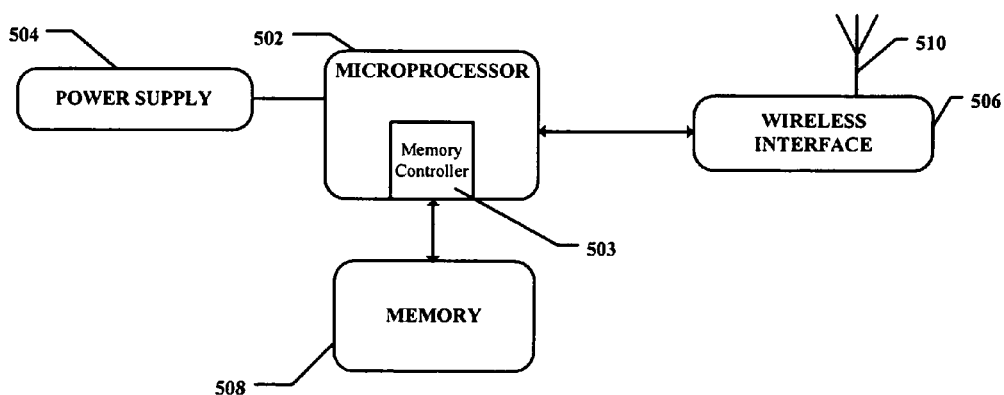
FIG. 5 is a block diagram of a computer system having a microprocessor with a memory controller having an extended clock in accordance with some embodiments.

With reference to FIG. 5, one example of a computer system is shown. The depicted system generally comprises a processor 502 that is coupled to a power supply 504, a wireless interface 506, and memory 508. It is coupled to the power supply 504 to receive from it power when in operation. The wireless interface 506 is coupled to an antenna 510 to communicatively link the processor through the wireless interface chip 506 to a wireless network (not shown). Microprocessor 502 comprises one or more memory controllers 503 with a system memory clock generated from an independent PLL, as disclosed herein, and provided to memory 508.

It should be noted that the depicted system could be implemented in different forms. That is, it could be implemented in a single chip module, a circuit board, or a chassis having multiple circuit boards. Similarly, it could constitute one or more complete computers or alternatively, it could constitute a component useful within a computing system.

The invention is not limited to the embodiments described, but can be practiced with modification and alteration within the spirit and scope of the appended claims. For example, it should be appreciated that the present invention is applicable for use with all types of semiconductor integrated circuit ("IC") chips. Examples of these IC chips include but are not limited to processors, controllers, chip set components, programmable logic arrays (PLA), memory chips, network chips, and the like.

Moreover, it should be appreciated that example sizes/ models/values/ranges may have been given, although the present invention is not limited to the same. As manufacturing techniques (e.g., photolithography) mature over time, it is expected that devices of smaller size could be manufactured. In addition, well known power/ground connections to IC chips and other components may or may not be shown within the FIGS. for simplicity of illustration and discussion, and so as not to obscure the invention. Further, arrangements may be shown in block diagram form in order to avoid obscuring the invention, and also in view of the fact that specifics with respect to implementation of such block diagram arrangements are highly dependent upon the platform within which the present invention is to be implemented, i.e., such specifics should be well within purview of one skilled in the art. Where specific details (e.g., circuits) are set forth in order to describe example embodiments of the invention, it should be apparent to one skilled in the art that the invention can be practiced without, or with variation of, these specific details. The description is thus to be regarded as illustrative instead of limiting.

What is claimed is:

1. A chip, comprising:
   a first PLL to generate a first clock signal based on a reference clock signal;

a second PLL to generate a second clock signal based on the reference clock signal, the second clock signal to be synchronized with the first clock signal;

wherein the first clock is to be provided to one or more domains in a memory controller, and the second clock is to be provided as a system memory clock.

2. The chip of claim 1, in which the memory controller is part of a microprocessor, and the system memory clock is to be used by off-chip memory devices to transfer data between said devices and the memory controller.

3. The chip of claim 1, further comprising a phase detector to compare the phase of the first clock signal with the phase of the second clock signal and to control the second PLL to synchronize the second clock signal with the first clock signal.

4. The chip of claim 3, further comprising a delay controller to control the delay of the second PLL.

5. The chip of claim 4, further comprising a variable delay device in the path of the second clock signal to provide fine tune delay in response to control from the delay controller.

6. The chip of claim 1, further comprising a data buffer coupled to the first and second clock signals to transfer data from a domain of the first clock signal to a domain of the second clock signal.

7. The chip of claim 1, in which the second PLL is powered from a supply that is isolated from the first PLL.

8. A memory controller comprising:
a memory controller host clock generated from a reference clock signal; and
an IO interface having a system memory clock generated from a PLL based on the reference clock signal, the PLL having a local feedback path from the system memory clock, the system memory and host clocks to be synchronized with one another.

9. The memory controller of claim 8, in which the PLL is a second PLL and the host clock is generated by a first PLL having an extended feedback path from the host clock signal to the first PLL.

10. The memory controller of claim 9, in which the first and second PLL supplies are isolated from one another.

11. The memory controller of claim 10, further comprising a phase detector to determine the phase relationship between the host and system memory clock signals.

12. The memory controller of claim 11, further comprising a delay controller coupled to the phase detector to control the phase relationship of the host and system memory clock signals based on their determined phase relationship.

13. The memory controller of claim 12, in which the delay controller is to control a variable delay circuit in the path of the system memory clock to alter its phase.

14. The memory controller of claim 13, in which the delay controller is to control second PLL to alter the phase of the system memory clock.

15. The memory controller of claim 8, in which the PLL is located in the IO interface.

16. A system, comprising:
(a) a microprocessor comprising a first PLL to generate a first clock signal based on a reference clock signal, a second PLL to generate a second clock signal based on the reference clock signal, the second clock signal to be synchronized with the first clock signal, the second PLL supplied by a power supply that is isolated from the supply of the first PLL;
(b) an antenna; and
(c) a wireless interface coupled to the microprocessor and to the antenna to communicatively link the microprocessor to a wireless network.

17. The system of claim 16, further comprising a memory chip coupled to the microprocessor to receive the second clock signal to implement data transfer between the memory device and microprocessor.

18. The system of claim 16, further comprising a battery to provide operational power to the microprocessor.

* * * * *